United States Patent
Tsai

(10) Patent No.: US 9,379,718 B2
(45) Date of Patent: Jun. 28, 2016

(54) ALL-DIGITAL PHASE-LOCKED LOOP (ADPLL)

(71) Applicant: Taiwan Semiconductor Manufacturing Company Limited, Hsin-Chu (TW)

(72) Inventor: Tsung-Hsien Tsai, Zhongli (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 33 days.

(21) Appl. No.: 14/261,467

(22) Filed: Apr. 25, 2014

(65) Prior Publication Data

US 2015/0311905 A1    Oct. 29, 2015

(51) Int. Cl.
*H03L 7/08* (2006.01)

(52) U.S. Cl.
CPC ........... *H03L 7/0802* (2013.01); *H03L 2207/50* (2013.01)

(58) Field of Classification Search
CPC ....... H03L 7/0802; H03L 7/099; H03L 7/104; H03L 2207/50; H03L 7/10; H03L 7/18; H03L 1/022; H03L 7/085

USPC ........... 327/156, 158, 161; 375/371, 375, 376
See application file for complete search history.

(56) References Cited

U.S. PATENT DOCUMENTS 7,778,610 B2 * 8/2010 Staszewski et al. ............. 455/76
2013/0278303 A1 * 10/2013 Chen et al. .................... 327/117

* cited by examiner

*Primary Examiner* — John Poos
(74) *Attorney, Agent, or Firm* — Cooper Legal Group, LLC

(57) ABSTRACT

An all-digital phase-locked loop (ADPLL) is provided. The ADPLL comprises a first circuit and a second circuit. The first circuit is configured to monitor a first signal and set a voltage of a second signal to a voltage within a first voltage range when a code of fine-tuning is equal to a first specified value. The first circuit is configured to set a voltage of a third signal to a voltage within a second voltage range when the code of fine-tuning is equal to a second specified value. The second circuit is configured to increase a code of coarse-tuning when the voltage of the second signal is within the first voltage range, and decrease the code of coarse-tuning when the voltage of the third signal is within the second voltage range. The ADPLL provides a target frequency despite changes in at least one of process, voltage or temperature.

20 Claims, 4 Drawing Sheets

ALL-DIGITAL PHASE-LOCKED LOOP (ADPLL)

BACKGROUND

An all-digital phase-locked loop (ADPLL) is a digital control system that is configured to output a signal having a phase that is related to an input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
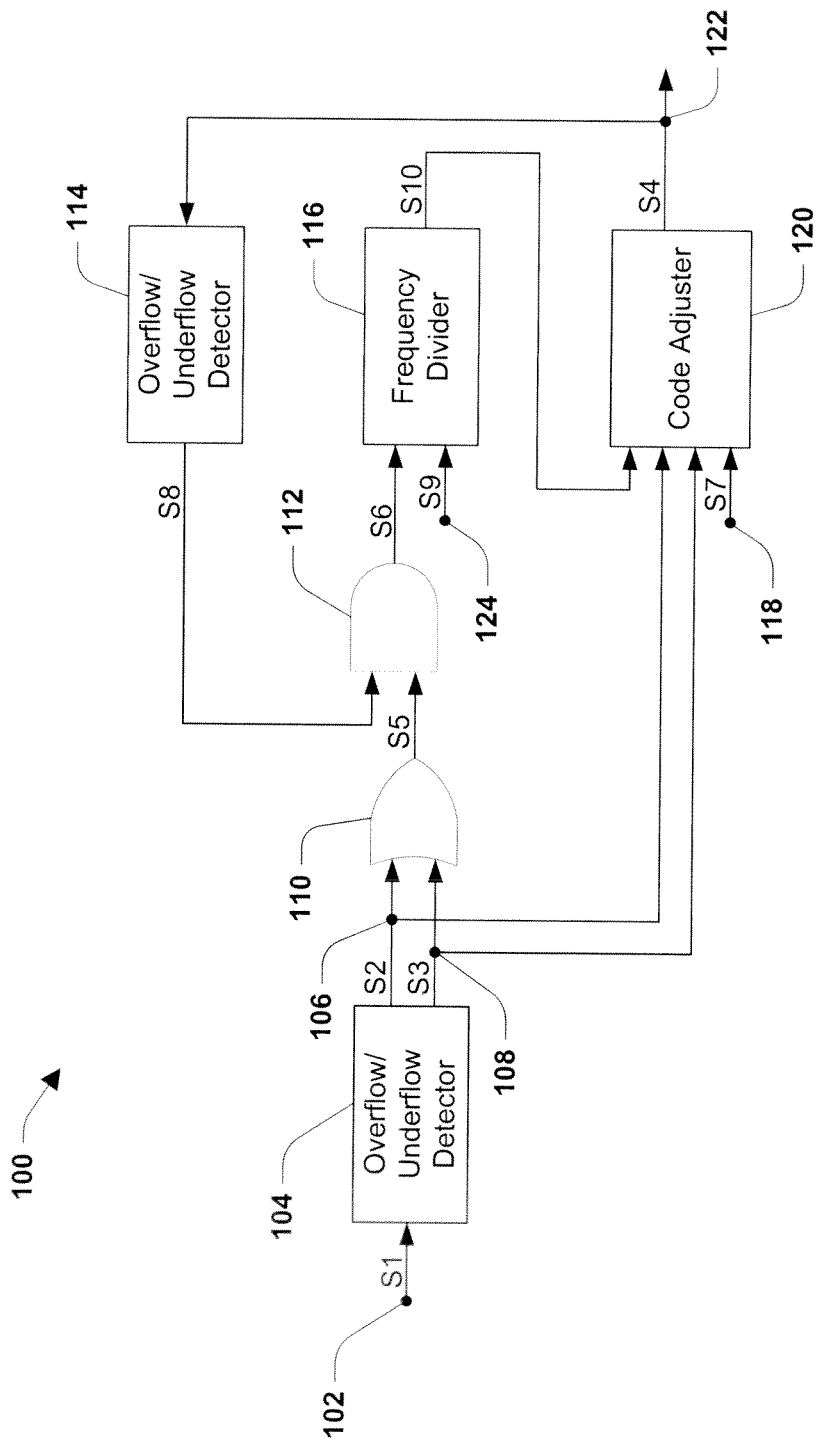
FIG. 1 is an illustration of a hardware block diagram, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an all-digital phase-locked loop (ADPLL) is provided. In some embodiments, the ADPLL is configured to output an output waveform at a target frequency. In some embodiments, the ADPLL comprises a coarse-tuning stage and a fine-tuning stage. In some embodiments, the coarse-tuning stage and the fine-tuning stage are respectively configured to modify a frequency of the output waveform so that the frequency of the output waveform is substantially equal to the target frequency or close to the target frequency.

In some embodiments, the coarse-tuning stage is associated with a code of coarse-tuning. In some embodiments, the code of coarse-tuning is a number that reflects a coarse-tuning output frequency. In some embodiments, a step-size of the code of coarse-tuning corresponds to a first frequency. In some embodiments, the coarse-tuning output frequency is equal to the first frequency multiplied by the code of coarse-tuning. In some embodiments, a maximum value of the code of coarse-tuning is equal to a third specified value. In some embodiments, a covering range of the coarse-tuning stage is the first frequency multiplied by the third specified value. In some embodiments, the first frequency is equal to 5 MHz and the third specified value is equal to 31. In this way, a covering range of the coarse-tuning stage is 31 multiplied by 5 MHz, which is 155 MHz or similar. In some embodiments, a minimum value of the code of coarse-tuning is equal to a fourth specified value. In some embodiments, the fourth specified value is equal to 0.

In some embodiments, the fine-tuning stage is associated with a code of fine-tuning. In some embodiments, the code of fine-tuning is a number that reflects a fine-tuning output frequency. In some embodiments, the code of fine-tuning comprises one bit that represents a sign of the code of fine-tuning. In some embodiments, the frequency of the output waveform is the coarse-tuning output frequency plus the fine-tuning output frequency. In some embodiments, a step-size of the code of fine-tuning corresponds to a second frequency. In some embodiments, the fine-tuning output frequency is equal to the second frequency multiplied by the code of fine-tuning. In some embodiments, a maximum value of the code of fine-tuning is equal to a first specified value. In some embodiments, a minimum value of the code of fine-tuning is equal to a second specified value. In some embodiments, the second specified value is equal to 0. In some embodiments, a covering range of the fine-tuning stage is equal to or greater than the first frequency corresponding to the step-size of the code of coarse-tuning.

In some embodiments, to account for at least one of process, voltage or temperature (PVT) variations, the fine-tuning stage is designed such that the covering range of the fine-tuning stage is 10 times greater than the first frequency, meaning a covering range ratio of the ADPLL is equal to 10. In this way, if the first frequency is 5 MHz, the covering range of the fine-tuning stage is 50 MHz or similar. In this way, if the second frequency is 400 kHz, the first specified value should be less than 50 MHz divided by 400 kHz, which equals 125. In this way, in some embodiments, the code of fine-tuning comprises 7 bits added to 1 bit representing the sign of the code of fine-tuning, which equals 8 bits. In some embodiments, it is desired to decrease the covering range ratio and a number of bits comprised by the code of fine-tuning, in order to decrease circuitry and power consumption of the ADPLL.

FIG. 1 illustrates a hardware-block diagram representing a portion of the ADPLL 100. In some embodiments, the hardware-block diagram 100 comprises a first node 102, a second node 106, a third node 108, a fourth node 124, a fifth node 118, a sixth node 122, a first circuit 104, a second circuit 120, a third circuit 116, a fourth circuit 114, an or-gate 110 and an and-gate 112.

In some embodiments, the first circuit 104 is configured to receive a first signal S1 at the first node 102. In some embodiments, the first signal S1 comprises the code of fine-tuning. In some embodiments, the first circuit 104 is configured to output a second signal S2 at the second node 106 and a third signal S3 at a third node 108. In some embodiments, the first circuit 104 is configured such that the second signal S2 has a voltage within a first voltage range when the code of fine-tuning is equal to the first specified value. In some embodiments, the first voltage range comprises about 3V to about 5 V. In some embodiments, the first circuit 104 is configured such that the third signal S3 has a voltage within a second voltage range when the code of fine-tuning is equal to the second specified value. In some embodiments, the second voltage range comprises about 3V to about 5 V. In some embodiments, the or-gate 110 receives the second signal S2 and the third signal S3. In some embodiments, the or-gate 110 is configured to output a fifth signal S5 that is a disjunction of the second signal S2 and the third signal S3. In some embodiments, the and-gate 112 receives the fifth signal S5. In some embodiments, the and-gate 112 receives an eighth signal S8 outputted by the fourth circuit 114. In some embodiments, the and-gate 112 outputs a sixth signal S6 that is received by the third circuit 116. In some embodiments, the third circuit 116 receives a reference frequency signal S9 at the fourth node 124, and outputs a frequency divider signal S10 based upon the sixth signal S6 and the reference frequency signal S9. In some embodiments, a frequency of the frequency divider signal S10 is not greater than a PLL bandwidth of the system divided by 2. In some embodiments, the second circuit 120 receives the frequency divider signal S10, the second signal S2, the third signal S3 and a seventh signal S7. In some embodiments, the seventh signal S7 comprises an initial code of coarse-tuning. In some embodiments, the second circuit 120 is configured to output a fourth signal S4 at the sixth node 122. In some embodiments, the fourth signal S4 comprises the code of coarse-tuning. In some embodiments, the second circuit 120 is configured to increase or decrease the code of coarse-tuning, based upon the frequency divider signal S10, the second signal S2, the third signal S3 and the seventh signal S7. In some embodiments, the fourth circuit 114 is configured to receive the fourth signal S4. In some embodiments, the fourth circuit 114 is configured to output the eighth signal S8. In some embodiments, the fourth circuit 114 is configured such that the eighth signal S8 has a voltage within a third voltage range when the code of coarse-tuning is equal to the third specified value and when the code of coarse-tuning is equal to the fourth specified value. In some embodiments, the third voltage range comprises about 3V to about 5 V.

In some embodiments, the third circuit 116 is a frequency divider. In some embodiments, the third circuit 116 does not output the frequency divider signal S10 when the voltage of the second signal S2 is within the first voltage range, and when the voltage of the third signal S3 is within the second voltage range. In some embodiments, the third circuit 116 does not output the frequency divider signal S10 when the voltage of the eighth signal S8 is within the third voltage range. In some embodiments, the fourth circuit 114 comprises a multiplexer. In some embodiments, the fourth circuit 114 comprises a summer. In some embodiments, the fourth circuit 114 comprises a comparator.

In some embodiments, the second circuit 120 comprises an accumulator. In some embodiments, the second circuit 120 uses the frequency divider signal S10 as a driving clock signal. In some embodiments, the second circuit 120 is configured to adjust the code of coarse-tuning. In some embodiments, the second circuit 120 is configured to increase the code of coarse-tuning when the voltage of the second signal S2 is within the first voltage range. In some embodiments, the second circuit 120 is configured to decrease the code of coarse-tuning when the voltage of the third signal S3 is within the second voltage range. In some embodiments, the second circuit 120 comprises a multiplexer and a summer.

Figure 2:
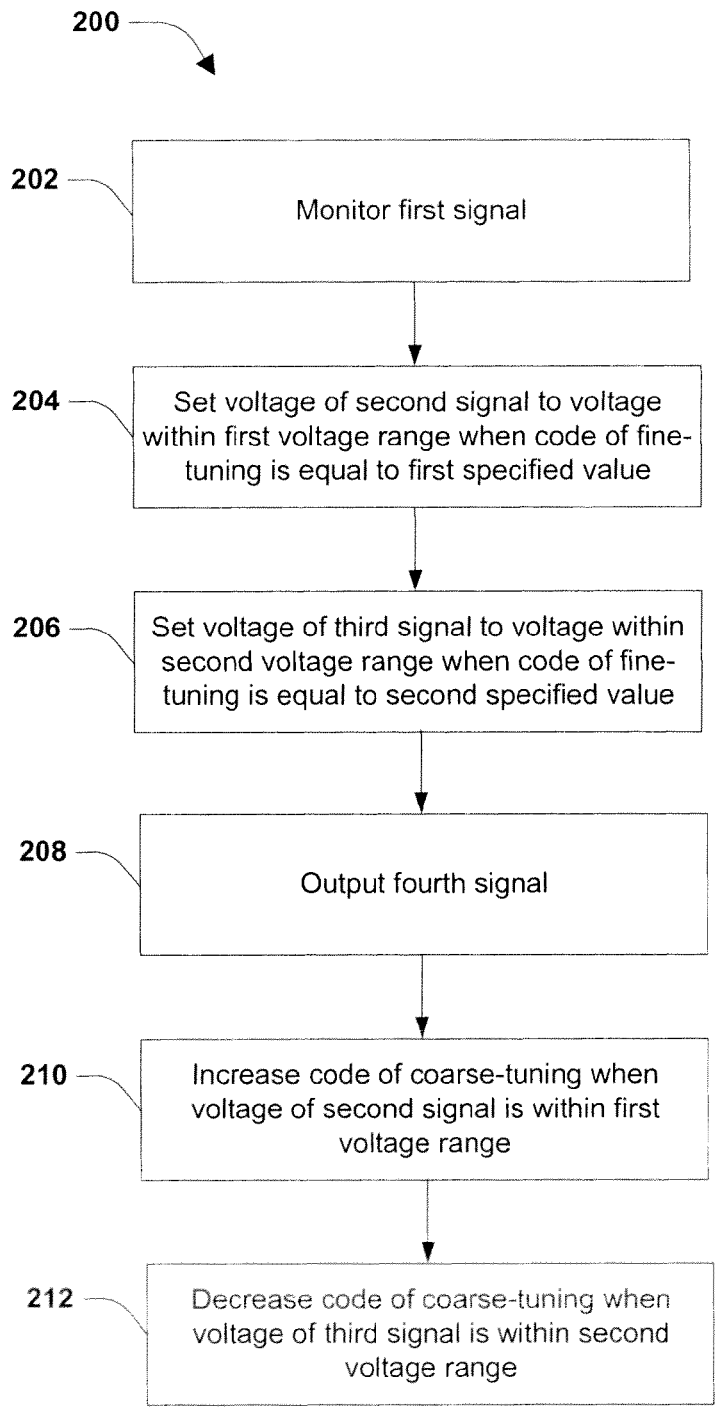
FIG. 2 illustrates a flow diagram of a method, in accordance with some embodiments.

FIG. 2 illustrates a method 200 of operating the ADPLL. In some embodiments, at 202, the first signal S1 is monitored by the first circuit 104. In some embodiments, at 204, the first circuit 104 is configured to set a voltage of the second signal S2 to a voltage within the first voltage range when the code of fine-tuning is equal to the first specified value. In some embodiments, at 206, the first circuit 104 is configured to set a voltage of the third signal S3 to a voltage within the second voltage range when the code of fine-tuning is equal to the second specified value. In some embodiments, at 208, the second circuit 120 is configured to output the fourth signal S4 comprising the code of coarse-tuning. In some embodiments, at 210, the second circuit 120 is configured to increase the code of coarse-tuning when the voltage of the second signal S2 is within the first voltage range. In some embodiments, at 212, the second circuit 120 is configured to decrease the code of coarse-tuning when the voltage of the third signal S3 is within the second voltage range.

In some embodiments, implementing the ADPLL by dynamically controlling the code of coarse-tuning, as shown with method 200, decreases the covering range ratio of the ADPLL, as opposed to not dynamically controlling the code of coarse-tuning. In some embodiments, the covering range ratio of the ADPLL can be less than 5 if the ADPLL has a system that dynamically controls the code of coarse-tuning according to the method 200.

Figure 3:
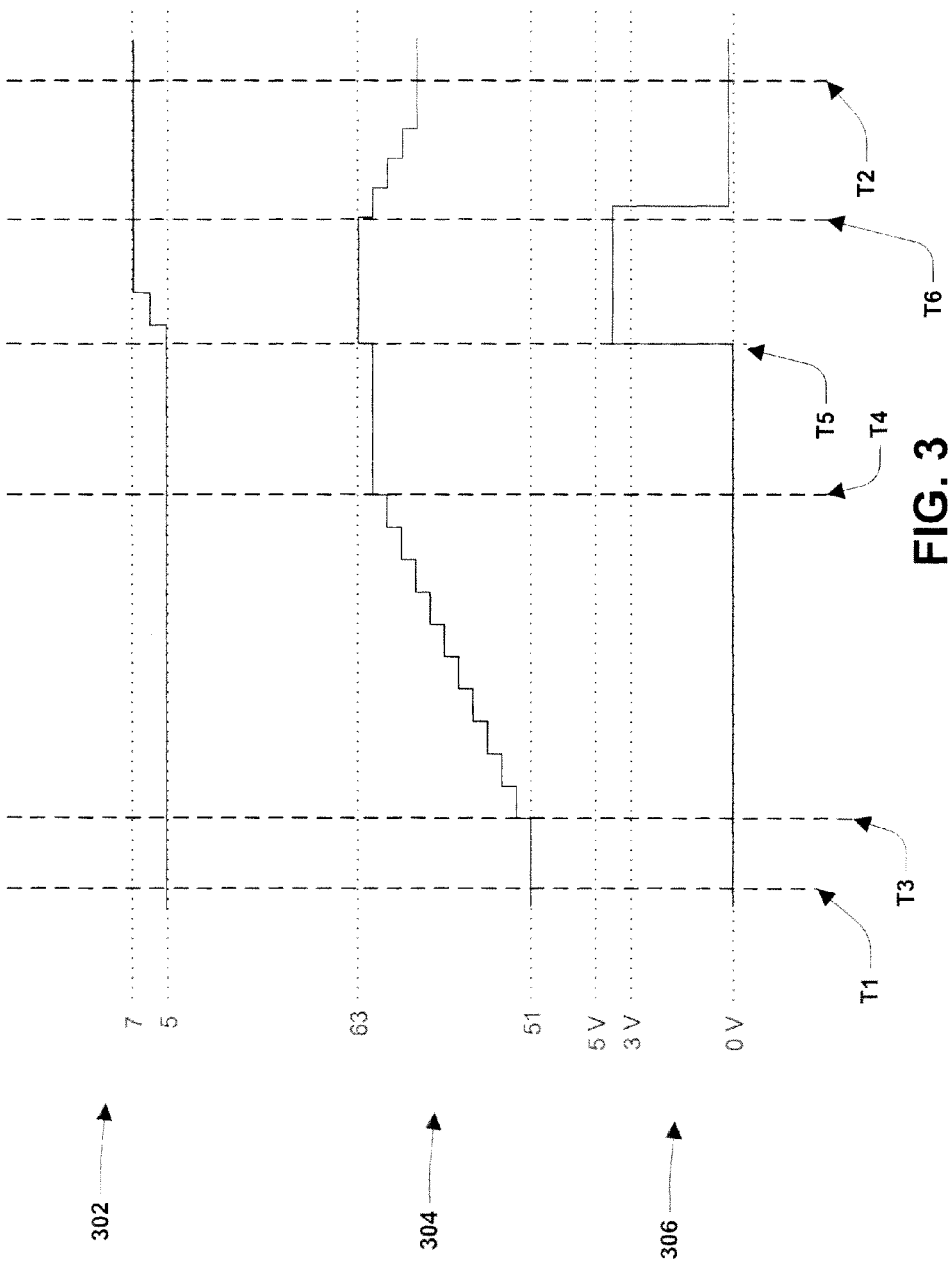
FIG. 3 is an illustration of waveforms, in accordance with some embodiments.

FIG. 3 is an illustration of waveforms corresponding to an example implementation of the ADPLL. In some embodiments, a first waveform 302 illustrates values of a code of coarse-tuning from a first point in time T1 to a second point in time T2. In some embodiments, a second waveform 304 illustrates values of a code of fine-tuning from the first point in time T1 to the second point in time T2. In some embodiments, a third waveform 306 illustrates voltages of the second signal S2 from the first point in time T1 to the second point in time T2. The third waveform 306 illustrates that at the first point in time T1, the voltage of the second signal S2 is substantially equal to 0 V. In the example implementation, the first frequency is equal to 5 MHz or similar. With the covering range ratio equal to 5, the covering range of the fine-tuning stage is 25 MHz or similar. In the example implementation, the second frequency is equal to 400 kHz or similar. In this way, in the example implementation, the first specified value is equal to 63. In the example implementation, at the first point in time T1, the code of coarse-tuning is equal to 5. In the example implementation, at the first point in time T1, the code of fine-tuning is equal to 51. In some embodiments, at the first point in time T1, the fine-tuning output frequency is equal to the second frequency multiplied by the code of fine-tuning, which is equal to 400 kHz multiplied by 51, which is equal to 20.4 MHz. In some embodiments, at the first point in time T1, the coarse-tuning output frequency is equal to the first frequency multiplied by the code of coarse-tuning, which is equal to 5 MHz multiplied by 5, which is equal to 25 MHz. In the example implementation, at the first point in time T1, the frequency of the output waveform is equal to about 45.4 MHz, which is equal to the target frequency, which is found by adding the coarse-tuning output frequency to the fine-tuning output frequency. In the example implementation, after the first point in time T1, PVT variations occur. In the example implementation, the PVT variations cause the frequency of the output waveform to decrease. In the example implementation, at a third point in time T3, the code of fine-tuning starts to increase in order to increase the frequency of the output waveform to the target frequency. In some embodiments, at the third point in time T3, the code of fine-tuning begins to increment In the example implementation, at a fourth point in time T4, the frequency of the output waveform is substantially equal to the target frequency and the code of fine-tuning settles at 62. In the example implementation, after the fourth point in time T4, PVT variations occur. In the example implementation, the PVT variations cause the frequency of the output waveform to decrease. In the example implementation, at a fifth point in time T5, the code of fine-tuning is increased to 63, which is the first specified value. In the example implementation, the code of fine-tuning being equal to the first specified value causes the voltage of the second signal S2 to change from 0 V to a voltage within the first voltage range which comprises voltages between about 3 V to about 5 V. In the example implementation, after the fifth point in time T5, the voltage of the second signal S2 being within the first voltage range causes the code of coarse-tuning to increase. In the example implementation, after the fifth point in time T5, the code of coarse-tuning increments twice such that before a sixth point in time, the code of coarse-tuning is equal to 7. In the example implementation, at a sixth point in time, the code of fine-tuning begins to decrease. In the example implementation, at the sixth point in time, the code of fine-tuning begins to decrement until it the code of fine-tuning is equal to 59. In the example implementation, the code of fine tuning being less than the second specified value causes the voltage of the second signal S2 to change from a voltage within the first voltage range to about 0 V.

Figure 4:
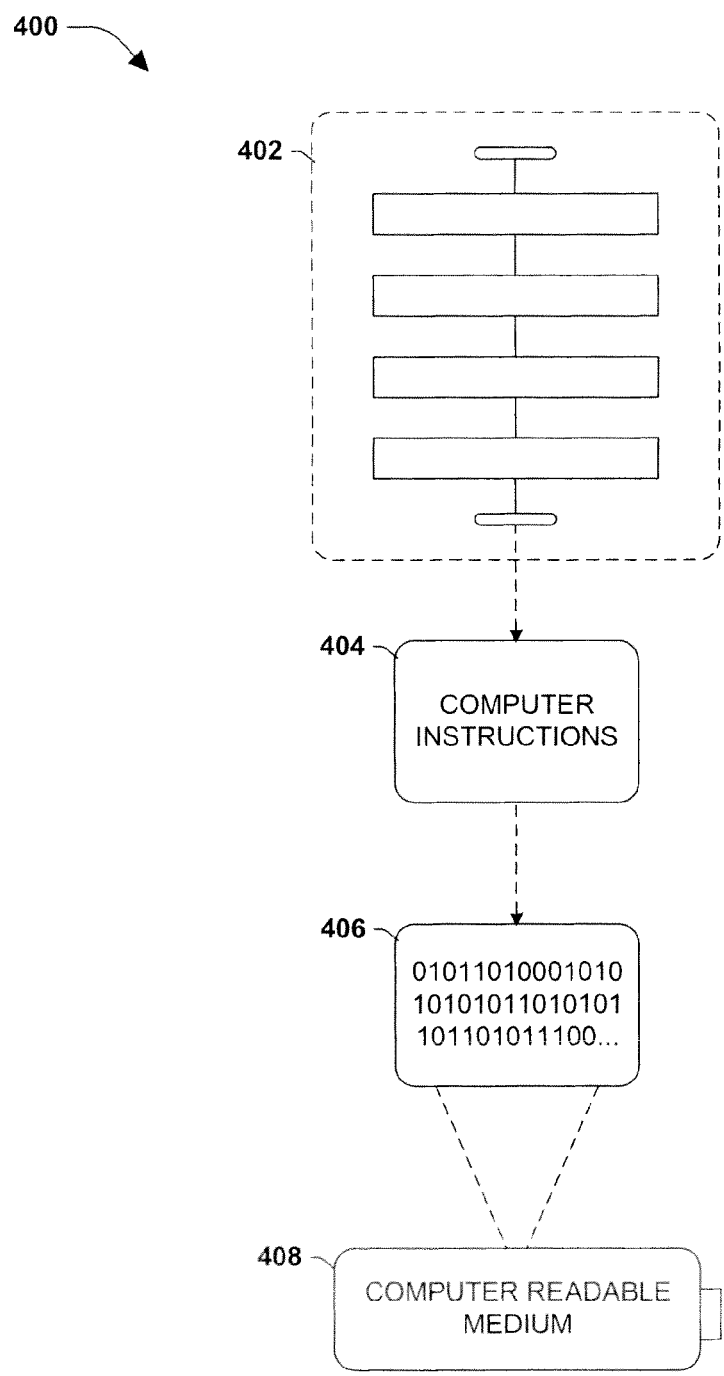
FIG. 4 illustrates an example computer-readable medium or computer-readable device comprising processor-executable instructions configured to embody one or more of the provisions set forth herein, according to various embodiments.

Still another embodiment involves a computer-readable medium comprising processor-executable instructions configured to implement one or more of the techniques presented herein. An example embodiment of a computer-readable medium and/or a computer-readable device that is devised in these ways is illustrated in FIG. 4, wherein the implementation 400 comprises a computer-readable medium 408, such as a CD-R, DVD-R, flash drive, a platter of a hard disk drive, etc., on which is encoded computer-readable data 406. This computer-readable data 406 in turn comprises a set of computer instructions 404 configured to operate according to one or more of the principles set forth herein. In one such embodiment 400, the processor-executable computer instructions 404 is configured to perform a method 402, such as at least some of the exemplary method 200 of FIG. 2, for example. Many such computer-readable media are devised by those of ordinary skill in the art that are configured to operate in accordance with the techniques presented herein.

In some embodiments, an ADPLL is provided, comprising a first circuit and a second circuit. In some embodiments, the first circuit is configured to monitor a first signal. In some embodiments, the first signal comprises a code of fine-tuning. In some embodiments, the first circuit is configured to output a second signal. In some embodiments, the second signal has a voltage within a first voltage range when the code of fine-tuning is equal to a first specified value. In some embodiments, the first circuit is configured to output a third signal. In some embodiments, the third signal has a voltage within a second voltage range when the code of fine-tuning is equal to a second specified value. In some embodiments, the second circuit is configured to output a fourth signal. In some embodiments, the fourth signal comprises a code of coarse-tuning. In some embodiments, the second circuit is configured to increase the code of coarse-tuning when the voltage of the second signal is within the first voltage range. In some embodiments, the second circuit is configured to decrease the code of coarse-tuning when the voltage of the third signal is within the second voltage range.

In some embodiments, an ADPLL is provided, comprising a first circuit, a logic gate, a third circuit, a fourth circuit and a second circuit. In some embodiments, the first circuit is configured to monitor a first signal, the first signal comprising a code of fine-tuning. In some embodiments, the first circuit is configured to detect when the code of fine-tuning is equal to a first specified value. In some embodiments, the first circuit is configured to detect when the code of fine-tuning is equal to a second specified value. In some embodiments, the first circuit is configured to output a second signal, the second signal having a voltage within a first voltage range when the code of fine-tuning is equal to the first specified value. In some embodiments, the first circuit is configured to output a third signal, the third signal having a voltage within a second voltage range when the code of fine-tuning is equal to the second specified value. In some embodiments, the logic gate is configured to receive the second signal, receive the third signal and output a fifth signal based upon the second signal and the third signal. In some embodiments, the third circuit is configured to receive a sixth signal, receive a reference frequency signal and output a frequency divider signal. In some embodiments, the fourth circuit is configured to monitor a fourth signal, the fourth signal comprising a code of coarse-tuning. In some embodiments, the fourth circuit configured to detect when the code of coarse-tuning is equal to a third specified value. In some embodiments, the fourth circuit is configured to detect when the code of coarse-tuning is equal to a fourth specified voltage. In some embodiments, the fourth circuit is configured to output an eighth signal, the eighth signal having a voltage within a third voltage range when the code of coarse-tuning is equal to the third specified value and when the code of coarse-tuning is equal to the fourth specified value. In some embodiments, the second circuit is configured to receive the frequency divider signal, receive the second signal, receive the third signal, receive a seventh signal and output the fourth signal based upon the frequency divider signal, the second signal, the third signal and the seventh signal.

In some embodiments, a method of operating an ADPLL is provided. In some embodiments, the method comprises monitoring a first signal, the first signal comprising a code of fine-tuning. In some embodiments, the method comprises setting a voltage of a second signal to a voltage within a first voltage range when the code of fine-tuning is equal to a first specified value. In some embodiments, the method comprises setting a voltage of a third signal to a voltage within a second voltage range when the code of fine-tuning is equal to a second specified value. In some embodiments, the method comprises outputting a fourth signal comprising a code of coarse-tuning. In some embodiments, the method comprises increasing the code of coarse-tuning when the voltage of the second signal is within the first voltage range. In some embodiments, the method comprises decreasing the code of coarse-tuning when the voltage of the third signal is within the second voltage range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An all-digital phase-locked loop (ADPLL), comprising:
a first circuit, configured to:
monitor a first signal, the first signal comprising a code of fine-tuning;
output a second signal, the second signal having a voltage within a first voltage range when the code of fine-tuning is equal to a first specified value; and
output a third signal, the third signal having a voltage within a second voltage range when the code of fine-tuning is equal to a second specified value;
a second circuit, configured to:
output a fourth signal, the fourth signal comprising a code of coarse-tuning;
increase the code of coarse-tuning when the voltage of the second signal is within the first voltage range; and
decrease the code of coarse-tuning when the voltage of the third signal is within the second voltage range; and
a third circuit, configured to:
output a frequency divider signal to the second circuit, wherein:
the frequency divider signal is generated based upon the second signal and the third signal, and
the second circuit generates the fourth signal based upon the frequency divider signal.

2. The ADPLL of claim 1, the second specified value equal to 0.

3. The ADPLL of claim 1, the first specified value equal to a maximum value of the code of fine-tuning.

4. The ADPLL of claim 1, a step-size of the code of coarse-tuning corresponding to a first frequency.

5. The ADPLL of claim 4, a step-size of the code of fine-tuning corresponding to a second frequency.

6. The ADPLL of claim 5, an output waveform having a frequency equal to the first frequency multiplied by the code of coarse-tuning, added to the second frequency multiplied by the code of fine-tuning.

7. The ADPLL of claim 1, comprising an or-gate configured to receive the second signal and the third signal and generate a fifth signal, the frequency divider signal generated based upon the fifth signal.

8. An all-digital phase-locked loop (ADPLL), comprising:
a first circuit, configured to:
monitor a first signal, the first signal comprising a code of fine-tuning;
detect when the code of fine-tuning is equal to a first specified value;
detect when the code of fine-tuning is equal to a second specified value;
output a second signal, the second signal having a voltage within a first voltage range when the code of fine-tuning is equal to the first specified value; and
output a third signal, the third signal having a voltage within a second voltage range when the code of fine-tuning is equal to the second specified value;
a logic gate, configured to:
receive the second signal;
receive the third signal; and
output a fifth signal based upon the second signal and the third signal;
a third circuit, configured to:
receive a sixth signal;
receive a reference frequency signal; and
output a frequency divider signal;
a fourth circuit, configured to:
monitor a fourth signal, the fourth signal comprising a code of coarse-tuning;
detect when the code of coarse-tuning is equal to a third specified value;
detect when the code of coarse-tuning is equal to a fourth specified value; and
output an eighth signal, the eighth signal having a voltage within a third voltage range when the code of coarse-tuning is equal to the third specified value and when the code of coarse-tuning is equal to the fourth specified value; and
a second circuit, configured to:
receive the frequency divider signal;
receive the second signal;
receive the third signal;
receive a seventh signal; and
output the fourth signal based upon the frequency divider signal, the second signal, the third signal and the seventh signal.

9. The ADPLL of claim 8, the logic gate being an or-gate.

10. The ADPLL of claim 8, comprising an and-gate.

11. The ADPLL of claim 10, the and-gate configured to:
receive the eighth signal;
receive the fifth signal; and
output a signal that is based upon the eighth signal and the fifth signal.

12. The ADPLL of claim 8, the frequency divider signal having a frequency that is less than half of a bandwidth of the ADPLL.

13. The ADPLL of claim 8, the second circuit comprising a multiplexer.

14. The ADPLL of claim 8, the third circuit comprising a multiplexer.

15. The ADPLL of claim 8, the fourth circuit comprising a comparator.

16. The ADPLL of claim 8, a range of the code of fine-tuning about 5 times greater than a range of a step-size of the code of course-tuning.

17. The ADPLL of claim 8, the first voltage range comprising about 3V to about 5 V.

18. The ADPLL of claim 8, the second voltage range comprising about 3V to about 5 V.

19. The ADPLL of claim 8, the third voltage range comprising about 3V to about 5 V.

20. A method of operating an all-digital phase-locked loop (ADPLL), comprising:
monitoring a first signal, the first signal comprising a code of fine-tuning;
setting a voltage of a second signal to a voltage within a first voltage range when the code of fine-tuning is equal to a first specified value;
setting a voltage of a third signal to a voltage within a second voltage range when the code of fine-tuning is equal to a second specified value;
adjusting a fourth signal comprising a code of coarse-tuning, wherein
the code of coarse-tuning is increased when the voltage of the second signal is within the first voltage range, and
the code of coarse-tuning is decreased when the voltage of the third signal is within the second voltage range; and
generating a frequency divider signal based upon the fourth signal, wherein the fourth signal is further adjusted based upon the frequency divider signal to create a feedback loop.

* * * * *